United States Patent
Pan et al.

(10) Patent No.: US 11,237,478 B2
(45) Date of Patent: Feb. 1, 2022

(54) CLEANING MODULE, CLEANING APPARATUS AND METHOD OF CLEANING PHOTOMASK

(71) Applicant: Taiwan Semiconductor Manufacturing Co., Ltd., Hsinchu (TW)

(72) Inventors: Yi-Hsun Pan, Tainan (TW); Kun-Lung Hsieh, Kaohsiung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/989,983

(22) Filed: Aug. 11, 2020

(65) Prior Publication Data

US 2020/0371432 A1     Nov. 26, 2020

Related U.S. Application Data

(62) Division of application No. 15/857,751, filed on Dec. 29, 2017, now Pat. No. 10,747,105, which is a division of application No. 14/154,780, filed on Jan. 14, 2014, now Pat. No. 9,857,680.

(51) Int. Cl.
*G03F 1/82* (2012.01)
*H01L 21/027* (2006.01)
*G03F 7/20* (2006.01)

(52) U.S. Cl.
CPC .............. *G03F 1/82* (2013.01); *H01L 21/027* (2013.01); *G03F 7/20* (2013.01); *G03F 7/70925* (2013.01)

(58) Field of Classification Search
CPC ........ G03F 1/82; H01L 21/027; H01L 21/302
See application file for complete search history.

(56) References Cited

U.S. PATENT DOCUMENTS

| | | | |
|---|---|---|---|
| 4,596,695 | A | 6/1986 | Cottingham |
| 4,722,355 | A | 2/1988 | Moe et al. |
| 4,986,141 | A | 1/1991 | Meurer |
| 5,476,413 | A | 12/1995 | Hasegawa et al. |
| 5,492,587 | A | 2/1996 | Hong |
| 6,558,239 | B2 | 5/2003 | Kunisawa et al. |
| 7,115,023 | B1 | 10/2006 | Owczarz |
| 7,462,248 | B2 | 12/2008 | Chiu et al. |

(Continued)

FOREIGN PATENT DOCUMENTS

| JP | 05229108 | 9/1993 |
|---|---|---|
| KR | 1020070011052 A | 1/2007 |

(Continued)

OTHER PUBLICATIONS

"CrystalWiper" CRW200 Woven Type Wiper, 2 pages.

(Continued)

*Primary Examiner* — Michael D Jennings
(74) *Attorney, Agent, or Firm* — Slater Matsil, LLP

(57) ABSTRACT

In a method of cleaning a photomask, a wiper tape is guided from a wiper tape supplying reel, over a cleaning head, and then onto a wiper tape collecting reel. A section of the wiper tape over the cleaning head is brought into contact with an adhesive residue on a surface of the photomask. A relative movement is caused between the photomask and the section of the wiper tape to remove the adhesive residue from the surface of the photomask.

20 Claims, 9 Drawing Sheets

(56) References Cited

U.S. PATENT DOCUMENTS

| | | | |
|---|---|---|---|
| 7,682,225 | B2 | 3/2010 | Hongo et al. |
| 7,993,485 | B2 | 8/2011 | Wasinger et al. |
| 9,335,279 | B2 * | 5/2016 | Delgado ............... G03F 1/82 |
| 2004/0090605 | A1 | 5/2004 | Yogev |
| 2008/0156346 | A1 | 7/2008 | Wang et al. |
| 2010/0078039 | A1 | 4/2010 | Wu et al. |
| 2010/0108104 | A1 | 5/2010 | Hsieh et al. |
| 2011/0023914 | A1 | 2/2011 | Jeong et al. |
| 2011/0203611 | A1 | 8/2011 | Uemura et al. |
| 2012/0211024 | A1 | 8/2012 | Dietze et al. |
| 2012/0234363 | A1 | 9/2012 | Cho et al. |
| 2013/0295494 | A1 | 11/2013 | Hsieh et al. |
| 2014/0084102 | A1 | 3/2014 | Techlin |
| 2014/0137347 | A1 | 5/2014 | Pan |
| 2014/0137890 | A1 | 5/2014 | Pan |
| 2014/0158157 | A1 | 6/2014 | Kobayashi |
| 2014/0226136 | A1 | 8/2014 | Gagnon |

FOREIGN PATENT DOCUMENTS

| | | |
|---|---|---|
| KR | 1020120101427 A | 9/2012 |
| TW | 200518173 | 6/2005 |
| TW | M370446 | 12/2009 |
| TW | 201039931 | 11/2010 |

OTHER PUBLICATIONS

Kure Line Co., Ltd. "Cleaning Equipment" Photomask Reticle Process Equipment, Dec. 6, 2013, www.clesen.jp/jpn/product/category1/index.html, 2 pages.

Pozetta Products "Eliminate Photomask Glue Lines" Dec. 6, 2013, www.pozzetta.com/products/photomask/PGR/Eliminate_Glue_Lines.asp, 1 page.

Savina Minimax "Savina MX" About Savina Wiping Cloths, 3 pages.

* cited by examiner

CLEANING MODULE, CLEANING APPARATUS AND METHOD OF CLEANING PHOTOMASK

CROSS-REFERENCE TO RELATED APPLICATIONS

This application is a divisional of U.S. application Ser. No. 15/857,751, filed on Dec. 29, 2017, entitled "Cleaning Module, Cleaning Apparatus and Method of Cleaning Photomask", which is a divisional of U.S. application Ser. No. 14/154,780, filed on Jan. 14, 2014, now U.S. Pat. No. 9,857,680 issued Jan. 2, 2018, entitled "Cleaning Module, Cleaning Apparatus and Method of Cleaning Photomask", each application is hereby incorporated herein by reference.

BACKGROUND

Semiconductor manufacture involves numerous processes, including deposition, photolithography, etch and the like processes. In a photolithography process, a photomask is used to pattern various features in semiconductor devices being manufactured. The cleanliness of a photomask is a consideration concerning quality of the patterned features and the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
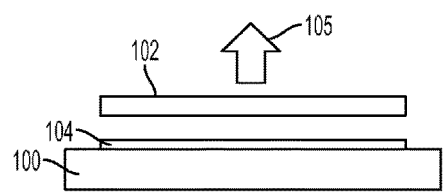
FIG. 1A is a schematic cross-section view of a photomask in a de-pellicle process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-section view of a photomask 100 in a de-pellicle process in accordance with some embodiments. To protect the photomask 100 from contaminants, a pellicle 102 is mounted on the photomask 100. In some embodiments, the pellicle 102 includes a frame and a transparent film stretched over and attached to one side of the frame. An opposite side of the frame is bonded to the photomask 100 by an adhesive 104. As a result, contaminants are deposited on the pellicle 102, rather than on the photomask 100 which is spaced from the deposited contaminants by a height of the frame. In a photolithography process, light is focused on the photomask 100 and the contaminants deposited on the pellicle 102 are unlikely to affect the quality of patterns to be produced. In some situations, the pellicle 102 is removed from the photomask 100 to permit the photomask 100 to be cleaned or reworked. This process is referred to as a de-pellicle process. When the pellicle 102 is removed from the photomask 100 in a de-pellicle process as indicated by arrow 105 in FIG. 1A, residue of the adhesive 104 remains on the photomask 100.

Figure 1B:
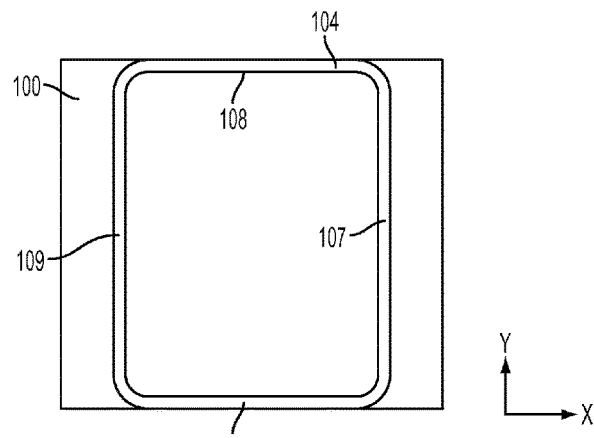
FIG. 1B is a schematic top view of a photomask after a de-pellicle process in accordance with some embodiments.

FIG. 1B is a schematic top view of the photomask 100 after a de-pellicle process in accordance with some embodiments. As indicated in FIG. 1 B, the residues of the adhesive 104 (hereinafter "adhesive residues") remain on the photomask 100 in bonding regions where the frame of the pellicle 102 was bonded to the photomask 100, and the adhesive residues have a shape of the frame of the pellicle 102. For example, the adhesive residues remain along the periphery of a rectangle having sides 106, 108 extending in the X direction, and sides 107, 109 extending in the Y direction, as shown in FIG. 1B. In some situations, the adhesive residues include intermittently arranged adhesive spots. In some situations, the adhesive residues include portions outside the bonding regions.

To remove the adhesive residues to prepare the photomask for subsequent processing, some embodiments provide one or more cleaning modules, cleaning apparatuses and/or methods of cleaning photomasks. In some embodiments, the described cleaning modules, cleaning apparatuses and/or methods are configured and/or used to remove substances other than adhesive and/or to clean substrates other than photomasks.

Figure 2A:
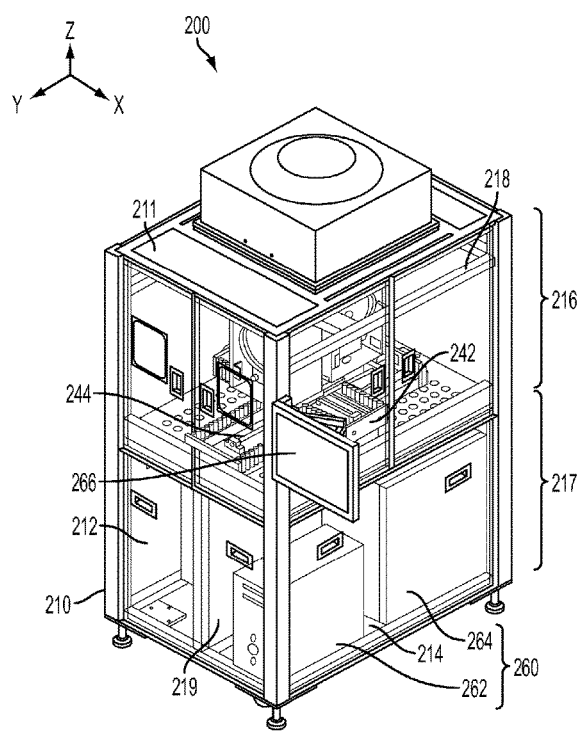
FIG. 2A is a schematic top-front-right perspective view of a cleaning apparatus in accordance with some embodiments.
Figure 2B:
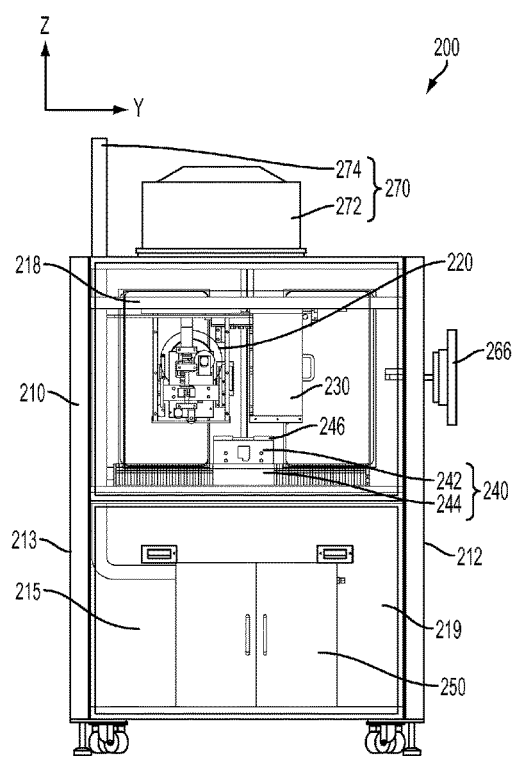
FIG. 2B is a schematic left view of a cleaning apparatus m accordance with some embodiments.

FIG. 2A is a schematic top-front-right perspective view of a cleaning apparatus 200, and FIG. 2B is a schematic left view of the cleaning apparatus 200 in accordance with some embodiments. The cleaning apparatus 200 includes a housing 210 accommodating therein one or more cleaning modules 220, 230, a stage 240, at least one cleaning substance storage 250, a controller 260, and a ventilation device 270.

The housing 210 is box-shaped and has a top wall 211, a bottom wall (not shown), a front wall 212, a rear wall 213, a right wall 214, and a left wall 215. In one or more embodiments, the top wall 211, bottom wall, front wall 212, rear wall 213, right wall 214, and left wall 215 of the housing 210 are hermetically coupled together to form a clean-room environment inside the housing 210. At least one of the walls of the housing 210 has a door arranged to permit an operator or equipment to access one or more components inside the housing 210. The housing 210 is divided into an upper section 216 and a lower section 217. The upper section 216 accommodates therein the cleaning modules 220, 230, and the stage 240. The upper section 216 includes a frame or rail arrangement 218 adjacent the top wall 211. The cleaning modules 220, 230 are mounted on the frame or rail arrangement 218 to be suspended above the stage 240. The lower section 217 includes a partition wall 219 dividing the lower section 217 into a left part adjacent the left wall 215 and a right part adjacent the right wall 214. The left part of the lower section 217 accommodates the cleaning substance storage 250. The right part of the lower section 217 accommodates the controller 260. The described arrangement of the housing 210 is an example. Other arrangements are within the scope of various embodiments.

The cleaning modules 220, 230 are arranged in the upper section 216 of the housing 210 and mounted on the frame or rail arrangement 218 to be suspended above the stage 240. In some embodiments, at least one of the cleaning modules 220, 230 is movable along the frame or rail arrangement 218 to be positioned corresponding to a spot to be cleaned on a substrate. In at least one embodiment, one of the cleaning modules 220, 230 is configured to clean the substrate along a first line extending in the first direction, whereas the other of the cleaning modules 220, 230 is configured to clean the substrate along a second line extending in the second direction transverse to the first direction. For example, the cleaning module 220 is arranged to clean the substrate along a line extending in the Y direction. When a photomask such as the photomask 100 shown in FIG. 1B is to be cleaned by the cleaning apparatus 200, the cleaning module 220 is arranged to remove adhesive residues along the sides 107, 109 which are oriented in the Y direction. Similarly, the cleaning module 230 is arranged to clean the substrate along a line extending in the X direction. When a photomask such as the photomask 100 shown in FIG. 1B is to be cleaned by the cleaning apparatus 200, the cleaning module 230 is arranged to remove adhesive residues along the sides 106, 108 which are oriented in the X direction. In some embodiments, the cleaning modules 220, 230 are configured to simultaneously clean different lines at the same time. In some embodiments, the cleaning modules 220, 230 are identically configured. In at least one embodiment, one of the cleaning modules 220, 230 is omitted. In at least one embodiment, more than two cleaning modules are included in the cleaning apparatus 200.

The stage 240 is arranged in the upper section 216 of the housing 210. The stage 240 includes an X-stage 242 and a Y-stage 244. The X-stage 242 has a substrate holder 246 configured to hold a substrate to be cleaned thereon. In at least one embodiment, the substrate is a photomask that underwent a de-pellicle process and has adhesive residues remaining thereon. The substrate holder 246 is configured to hold the substrate by vacuum, mechanical engagement, or the like arrangements. The X-stage 242 is configured to move the substrate holder 246 with the substrate held thereon in the X direction to cause a relative movement in the X direction between the substrate to be cleaned and one or more of the cleaning modules 220, 230. The Y-stage 244 is configured to move the X-stage 242 with the substrate held thereon in the Y direction to cause a relative movement in the Y direction between the substrate to be cleaned and one or more of the cleaning modules 220, 230. In at least one embodiment, the stage 240 is further configured to cause a relative movement in the Z direction between the substrate to be cleaned and one or more of the cleaning modules 220, 230. The described arrangement of the stage 240 is an example. Other arrangements are within the scope of various embodiments.

The cleaning substance storage 250 is arranged in the lower section 217 of the housing 210. The cleaning substance storage 250 is configured to store one or more cleaning substances. In at least one embodiment, the one or more cleaning substances include a solvent or solvents of the material to be removed from the substrate to be cleaned. In at least one embodiment, more than two cleaning substances are stored in the cleaning substance storage 250. In at least one embodiment, the cleaning substance storage 250 is configured to dispense different cleaning substances at different stages to clean the same surface of the substrate. In some embodiments, the cleaning substance storage 250 is coupled to at least one of the cleaning modules 220, 230 to supply one or more cleaning substances to the cleaning module(s). In some embodiments, the cleaning substance storage 250 is coupled to a nozzle arranged at the stage 240 to dispense one or more cleaning substances on the substrate. In at least one embodiment, the cleaning substance storage 250 is omitted from the cleaning apparatus 200, and a cleaning substance is supplied, e.g., via piping, from an external storage into the housing 210. The described arrangement of the cleaning substance storage 250 is an example. Other arrangements are within the scope of various embodiments.

The controller 260 includes a computer 262 and one or more application specific integrated circuits (ASICs) 264. In some embodiments, the computer 262 includes at least one processor, a memory, a network interface, a storage device, an input/output (I/O) device or other interconnection communication mechanisms. The memory comprises, in some embodiments, a random access memory (RAM) and/or other dynamic storage device and/or read only memory (ROM)

and/or other static storage device. The memory is used, in some embodiments, for storing temporary variables or other intermediate information during execution of instructions to be executed by the processor. In some embodiments, the storage device, such as a magnetic disk or optical disk, is configured to store data and/or instructions. The I/O device comprises an input device, an output device and/or a combined input/output device for enabling user interaction. For example, a touch screen 266 is provided at the front wall 212 of the housing 210 and configured as a user interface for I/O interaction with the computer 262 and/or the ASIC 264. In another example, a camera (not shown) is provided in the upper section 216 of the housing 210 and facing the stage 240 to capture and transmit one or more images of the surface to the computer 262 and/or ASIC 264. The computer 262 and/or ASIC 264 is configured to analyze the captured images to determine if the substrate has been cleaned, or another cleaning operation with the same or different parameters is to be performed. Other types of I/O devices, such as mice, keyboards, and the like I/Os are within the scope of various embodiments. In some embodiments, the ASIC 264 defines an interface between the computer 262 and other components in the cleaning apparatus 200, such as the cleaning modules 220, 230, the stage 240, and the cleaning substance storage 250. In at least one embodiment, the ASIC 264 is a stand-alone controller of at least one component of the cleaning apparatus 200. In at least one embodiment, at least one of the computer 262 or the ASIC 264 is omitted from the cleaning apparatus 200, and/or provided outside the housing 210. The described arrangement of the controller 260 is an example. Other arrangements are within the scope of various embodiments.

The ventilation device 270 includes a blower 272 and an exhaust piping 274. The blower 272 is arranged on the top wall 211 and configured to generate an air flow through the housing 210 and around the cleaning modules 220, 230 and the stage 240. The air flow then escapes the housing 210 via the exhaust piping 274. The air flow keeps the interior of the housing 210 under pressure and moves contaminants away from the substrate being cleaned. In at least one embodiment, the air flow removes vapor and/or odor of one or more cleaning substances stored in the cleaning substance storage 250 from the housing 210. In the specific configuration shown in FIGS. 2A-2B in accordance with some embodiments, the cleaning modules 220, 230 and the stage 240 are arranged upstream of the cleaning substance storage 250, to prevent vapor of the cleaning substance(s) from undesirably reaching the cleaning modules 220, 230 and/or the substrate to be cleaned. In at least one embodiment, the ventilation device 270 is omitted from the cleaning apparatus 200. The described arrangement of the ventilation device 270 is an example. Other arrangements are within the scope of various embodiments.

Figure 3A:
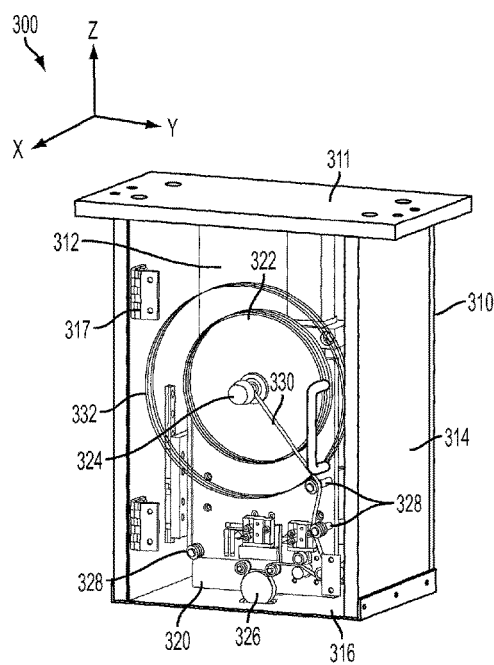
FIG. 3A is a schematic top-front-right perspective view of a cleaning module in accordance with some embodiments.
Figure 3B:
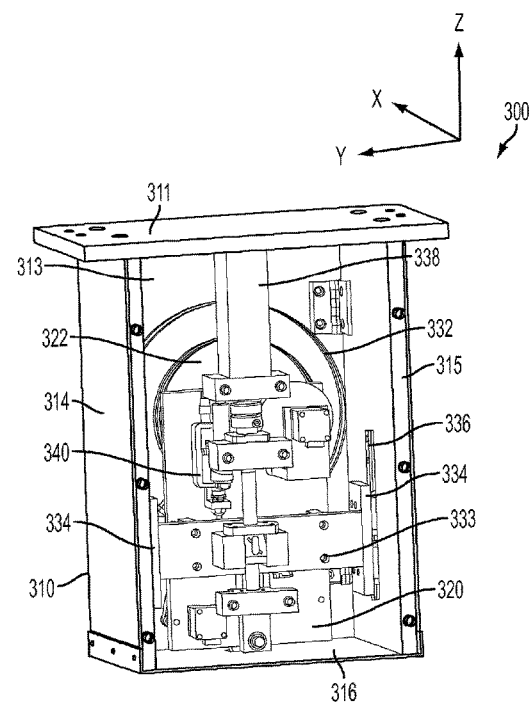
FIG. 3B is a schematic top-rear-right perspective view of a cleaning module in accordance with some embodiments.

FIG. 3A is a schematic top-front-right perspective view of a cleaning module 300, and FIG. 3B is a schematic top-rear-right perspective view of the cleaning module 300 in accordance with some embodiments. In some embodiments, the cleaning module 300 corresponds to one of the cleaning modules 220, 230 of the cleaning apparatus 200.

The cleaning module 300 includes a case 310. The case 310 is box-shaped and has a top wall 311, a front wall 312, a rear wall 313, a right wall 314, a left wall 315, and a bottom wall 316. At least one of the walls of the case 310 has a door arranged to permit an operator or equipment to access one or more components inside the case 310. For example, the front wall 312 defines a door attached to the left wall 315 by a hinge 317. The top wall 311 has an arrangement (not shown) configured to attach the cleaning module 300 to a support, such as the frame or rail arrangement 218 described with respect to FIGS. 2A-2B. The described arrangement of the case 310 is an example. Other arrangements are within the scope of various embodiments.

The cleaning module 300 further includes a base member 320 arranged in a middle of the case 310, between the front wall 312 and the rear wall 313. In the specific configuration shown in FIGS. 3A-3B, the base member 320 is a board. Other configurations for the base member 320 are within the scope of various embodiments.

A front side of the base member 320 is best seen in FIG. 3A. A wiper tape supplying reel 322 and a wiper tape collecting reel 324 are rotatably supported on the front side of the base member 320. In the specific configuration shown in FIG. 3A, the wiper tape supplying reel 322 and wiper tape collecting reel 324 are supported to be rotatable about a common rotational axis. A cleaning head 326 and one or more guide rollers 328 are also mounted on the front side of the base member 320. A wiper tape 330 is guided continuously from the wiper tape supplying reel 322, through one or more guide rollers 328, around the cleaning head 326, and then to the wiper tape collecting reel 324. A section of the wiper tape 330 guided around the cleaning head 326 is used to clean a substrate as described herein. A separation member 332, such as a disk, is provided between the wiper tape supplying reel 322 and the wiper tape collecting reel 324 to prevent the wiper tape 330 which has been used to clean the substrate and collected onto the wiper tape collecting reel 324 from soiling the fresh wiper tape 330 on the wiper tape supplying reel 322.

A rear side of the base member 320 is best seen in FIG. 3B. A transverse member 333 is attached to the rear side of the base member 320. First sliding members 334 are provided at opposite ends of the transverse member 333. Second sliding members 336, such as raised guides, are provided on inner surfaces of the right wall 314 and the left wall 315, and are slidably engaged with the corresponding first sliding members 334. In some embodiments, the second sliding members 336 include slots formed in the inner surfaces of the right wall 314 and the left wall 315. The slidable engagement between the second sliding members 336 on the right wall 314 and the left wall 315 of the case 310, and the first sliding members 334 carried by the base member 320 renders the base member 320 moveable in the Z direction relative to the case 310. A driver 338 is attached to the base member 320 and to the case 310 to move the base member 320 in the Z direction relative to the case 310. Examples of the driver 338 include, but are not limited to, a motor, an air cylinder, and the like actuators. A pressure sensor 340 is also mounted on the rear side of the base member 320. The described arrangement of the base member 320 and the components mounted thereon is an example. Other arrangements of various components in the case 310 are within the scope of various embodiments.

Figure 3C:
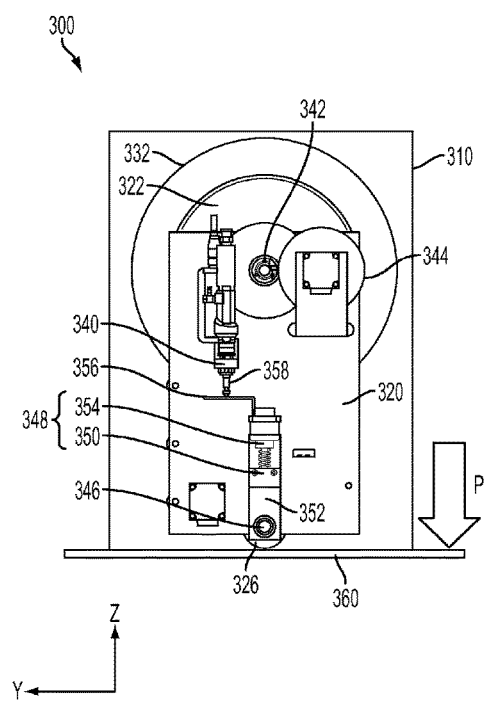
FIG. 3C is a schematic rear view of one or more components of a cleaning module in accordance with some embodiments.

FIG. 3C is a schematic rear view of some components of the cleaning module 300 in accordance with some embodiments. FIG. 3C shows the rear side of the base member 320 on which the pressure sensor 340 is mounted. The base member 320 further support a rotational shaft 342 which defines a support structure for rotatably supporting the wiper tape supplying reel 322 and the wiper tape collecting reel 324. The rotational shaft 342 defines a common rotational axis for the wiper tape collecting reel 324 and the wiper tape supplying reel 322. In some embodiments, the rotational shaft 342 includes two sections (not shown) each rotatably supporting a corresponding one of the wiper tape supplying reel 322 and wiper tape collecting reel 324, and the sections of the rotational shaft 342 is separated by the separation member 332 mounted therebetween.

A wiper tape feeder 344 is mounted on the base member 320 to drive the wiper tape supplying reel 322 to feed out a length of fresh wiper tape 330 for cleaning a substrate as described herein, and/or to drive the wiper tape collecting reel 324 to collect a length of used wiper tape 330. In an example configuration, the wiper tape feeder 344 includes at least one motor. In at least one embodiment, the wiper tape feeder 344 includes two motors configured to independently drive the wiper tape supplying reel 322 and wiper tape collecting reel 324. In at least one embodiment, a transmission arrangement, e.g., one or more gear wheels, is provided to transmit driving power of the wiper tape feeder 344 to at least one of the wiper tape supplying reel 322 and wiper tape collecting reel 324.

The cleaning head 326 is rotationally mounted on a rotational shaft 346. The rotational shaft 346 is supported, via a spring 348, by the base member 320. In the example configuration indicated in FIG. 3C, the spring 348 has a first end 350 connected to a first connecting member 352 on which the rotational shaft 346 of the cleaning head 326 is rotationally mounted. A second end 354 of the spring 348 is attached to the base member 320 and connected to a second connecting member 356. The pressure sensor 340 has a probe end 358 touching the second connecting member The pressure sensor 340 is configured to detect a pressure P exerted by the cleaning head 326 on a substrate 360 to be cleaned by the cleaning head 326. In at least one embodiment, the substrate 360 is supported on a stage, such as the stage 240 as described with respect to FIGS. 2A-2B.

The pressure sensor 340 provides a pressure feedback to a controller, such as the controller 260 as described with respect to FIG. 2A. If the pressure P detected by the pressure sensor 340 is higher than a predetermined threshold or range, the controller 260 causes the cleaning head 326 and the substrate 360 to be moved away from each other in the Z direction, to prevent, or at least minimizing a likelihood of, damages to the substrate 360 due to the high pressure P. If the pressure P detected by the pressure sensor 340 is lower than a predetermined threshold or range, the controller 260 causes the cleaning head 326 and the substrate 360 to be moved toward each other in the Z direction, to increase the cleaning efficiency which is likely insufficient due to the low pressure P. In at least one embodiment, a relative movement of the cleaning head 326 and the substrate 360 in the Z direction is effected by the driver 338 which lowers or raises the base member 320 with the cleaning head 326 mounted thereon. In at least one embodiment, a relative movement of the cleaning head 326 and the substrate 360 in the Z direction is effected by a Z-direction movement of the stage 240. In at least one embodiment, a relative movement of the cleaning head 326 and the substrate 360 in the Z direction is effected by both the driver 338 and the stage 240. The spring 348 is configured to absorb slight fluctuations in the pressure P without triggering the controller 260 to cause the cleaning head 326 and the substrate 360 to be moved toward to away from each other. For example, when the cleaning head 326 comes into contact with a clean area of the substrate 360 and when the cleaning head 326 comes in to contact with an area with adhesive residue on the substrate 360, the pressure P varies slightly and the spring 348 absorbs such a variation. Examples of pressure sensor 340 include, but are not limited to, piezoresistive sensor, capacitive sensor, electromagnetic sensor, piezoelectric sensor, optical sensor, and potentiometric sensor. The described pressure feedback control is an example. Other arrangements for pressure feedback control are within the scope of various embodiments.

Figure 3D:
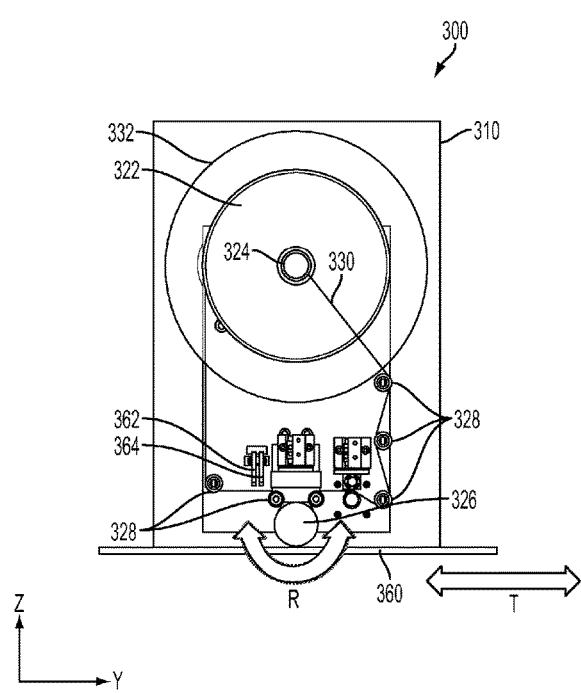
FIG. 3D is a schematic front view of one or more components of a cleaning module in accordance with some embodiments.

FIG. 3D is a schematic front view of one or more components of the cleaning module 300 in accordance with some embodiments. FIG. 3D shows the front side of the base member 320. As described herein with respect to FIG. 3A and as shown in FIG. 3D, the wiper tape 330 is continuously guided along a wiper tape path from the wiper tape collecting reel 324, via a number of guide rollers 328, over a portion of the cleaning head 326, via a number of further guide rollers 328, and then back to the wiper tape collecting reel 324. The number and/or arrangement of the guide rollers 328 and/or the length and shape of the wiper tape path shown in FIG. 3D are examples. Other arrangements for guiding the wiper tape 330 are within the scope of various embodiments.

In at least one embodiment, the wiper tape 330 includes an absorptive, chemical resistant material with dust trapping capability. The absorbency and chemical resistance of the wiper tape 330 permits the wiper tape 330 to carry a cleaning substance, e.g., a solvent, to the substrate 360 to remove a material (e.g., adhesive) to be removed, as described herein. The dust trapping capability of the wiper tape 330 permits the wiper tape 330 to trap contaminants, such as dust and by products of the reaction between the cleaning substance and the material. Examples of the wiper tape 330 include, but are not limited to, wipers which are used for cleaning flat display panels, such as TVs or monitors, or for cleaning other types of glass plates. In some embodiments, the wiper tape 330 includes a band of woven cloth of 75% polyester and 25% nylon, identified as CRW200 Woven Type Wiper available under the trademark CRYSTALWIPER®. In some embodiments, the wiper tape 330 includes a band of woven or knit cloth including split yarn or fiber, available under the trademark SAVINA® MX. In some embodiments, a width of the wiper tape 330 is smaller than a width of the substrate 360, and the entire surface of the substrate 360 is cleaned by moving the cleaning module 300 over the substrate 360 in several parallel lines. In some embodiments, the width of the wiper tape 330 is equal to or greater than the width of the substrate 360, and the entire surface of the substrate 360 is cleaned by moving the cleaning module 300 over the substrate 360 in a single line.

At least one nozzle is arranged along the wiper tape path and upstream of the cleaning head 326. In the specific configuration shown in FIG. 3D, two nozzles 362, 364 are mounted on the base member 320, upstream of the cleaning head 326 and are configured to dispense at least one cleaning substances onto a section of the wiper tape 330 facing the nozzles 362, 364. The section of the wiper tape 330 with the cleaning substance dispensed thereon is then fed over the cleaning head 326 to clean the substrate 360 with both chemical action of the cleaning substance and mechanical action of the wiper tape 330, as described herein. To remove adhesive residues from a photomask, example cleaning substances include, but are not limited to, Ethanol, HP thinner, and NGC04. The arrangement and/or number of nozzles shown in FIG. 3D are examples. Other arrangements for supplying at least one cleaning substance to material to be removed from the substrate 360 are within the scope of various embodiments. For example, in at least one embodiment, the nozzles 362, 364 are omitted from the cleaning module 300, and one or more cleaning substances are directly dispensed on the substrate 360.

The cleaning head 326 is rotatable about the rotational shaft 346 (FIG. 3C). The rotational shaft 346 is oriented in a direction transverse to the direction in which the cleaning module 300 is to be moved relative to the substrate 360. For example, in the specific configuration shown in FIGS. 3C-3D, the rotational shaft 346 is oriented in the X direction which is perpendicular to the Z direction in which the cleaning module 300 is to be moved relative to the substrate 360. In at least one embodiment, the cleaning head 326 is rotated by a movement of the wiper tape 330 between the wiper tape supplying reel 322 and wiper tape collecting reel 324. For example, when a length of the wiper tape 330 is fed out from the wiper tape supplying reel 322 and another length of the wiper tape 330 is collected onto the wiper tape collecting reel 324, the cleaning head 326 is caused by the movement of the wiper tape 330 to rotate counter-clockwise. In at least one embodiment, a length of the wiper tape 330 is repeatedly fed out from and then wound back onto the wiper tape supplying reel 322, while another length of the wiper tape 330 is repeatedly collected onto and then fed back out from the wiper tape collecting reel 324. As result the cleaning head 326 is caused to rotate back and forth both counter-clockwise and clockwise, as indicated by arrow R in FIG. 3D. In at least one embodiment, the cleaning head 326 is actively driven by a driver, such as a motor (not shown). In at least one embodiment, the cleaning head 326 is not rotatable.

The cleaning head 326 is configured to bring a section of the wiper tape 330 guided over the cleaning head 326 into contact with the substrate 360 during a relative movement between the cleaning head 326 and the substrate 360. In at least one embodiment, the relative movement includes both a translational movement T of the substrate 360 relative to the cleaning head 326 and a rotational movement R of the cleaning head 326 about the rotational shaft 346 (FIG. 3C). In at least one embodiment, the relative movement includes either the translational movement T or the rotational movement R. In some embodiments, the rotational movement R and/or the translational movement T is unidirectional. In some embodiments, the controller 260 selects the type and/or speed of the relative movement to be performed between the cleaning head 326 and the substrate 360 based on various factors, including, but not limited to, the type, thicknesses and area of the material to be removed. For example, for cleaning a lightly soiled region with a small area and/or thickness of adhesive residues, the controller 260 in accordance with some embodiments causes a uni-directional translational movement T between the cleaning head 326 and the substrate 360, while rotating the cleaning head 326 to clean the soiled region in a single pass. For cleaning a more heavily soiled region with a larger area and/or thickness of adhesive residues, the controller 260 in accordance with some embodiments causes the translational movement T to be performed at a slower speed and the rotational movement R of the cleaning head 326 to be performed at a higher speed to increase the cleaning action of the wiper tape 330 on the substrate 360. For cleaning a heavily soiled region with an even larger area and/or thickness of adhesive residues, the controller 260 in accordance with some embodiments stops the translational movement T and causes a bi-directional rotational movement R of the cleaning head 326 to be performed to clean one portion of the soiled region at a time. When a portion of the soiled region is cleaned, the controller 260 causes a small translational movement T to advance the cleaning head 326 to the next portion of the soiled region where the translational movement T is again stopped and a bi-directional rotational movement R of the cleaning head 326 is again performed to clean the next portion.

In some embodiments, the cleaning action is further improved by controlling how the cleaning substance is dispensed onto the wiper tape 330. In at least one embodiment, a cleaning substance is dispensed continuously on the wiper tape 330 during the cleaning operation. In at least one embodiment, the cleaning substance is dispensed intermittently on the wiper tape 330 during the cleaning operation. In at least one embodiment, for cleaning a heavily soiled region, the amount of the cleaning substance dispensed on the wiper tape 330 is increased, and/or the cleaning substance dispensed at a higher frequency, and/or multiple different cleaning substances are dispensed successively or simultaneously on the wiper tape 330. In some embodiments, different cleaning substances are dispensed on the wiper tape 330 in different passes of the cleaning head 326 over a soiled region. For example, to clean adhesive residues along the line 107 on the photomask 100 in FIG. 1B, a first cleaning substance is dispensed on the wiper tape 330 as the cleaning module 300 is moved in the Y direction along the line 107 in the first pass. The first cleaning substance reacts with, dissolves and/or dislodges the adhesive residues from the photomask 100, and the moving wiper tape 330 carries the byproducts of the reaction and/or the dislodged adhesive residues and/or other types of contaminants away from the photomask 100. In a second pass, a second cleaning substance is dispensed on the wiper tape 330 as the cleaning module 300 is again moved in the Y direction along the line 107, to remove contaminants remaining on the photomask 100 after the first pass. The described cleaning operation is an example. Other cleaning operations with various settings on the type, direction, number and speed of movement and/or type, amount and dispensing frequency of cleaning substance and/or the like factors are within the scope of various embodiments.

Figure 3E:
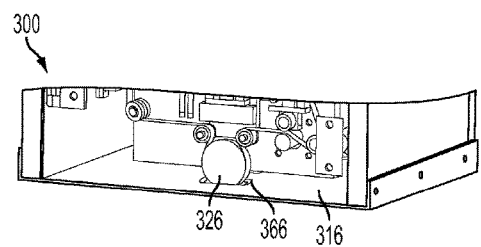
FIG. 3E is a schematic, top-front-right perspective view of a portion of a cleaning module in accordance with some embodiments.
Figure 3F:
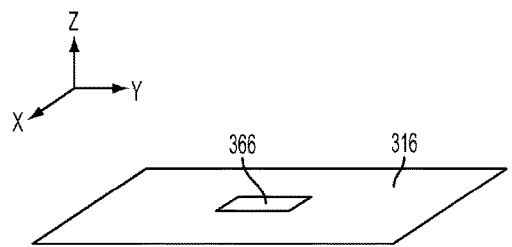
FIG. 3F is a schematic perspective view of a wall of a case of a cleaning module in accordance with some embodiments.
Figure 3G:
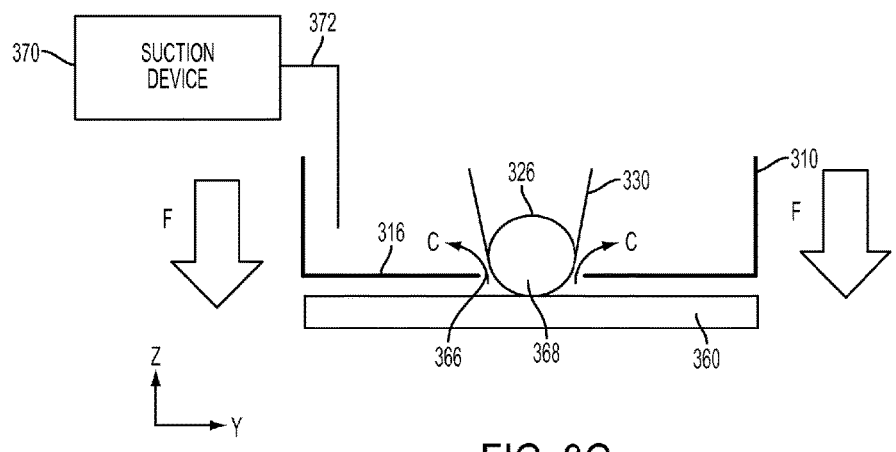
FIG. 3G is a schematic front view of one or more components in a portion of a cleaning module in accordance with some embodiments.

FIG. 3E is a schematic, top-front-right perspective view of a lower portion of the cleaning module 300, FIG. 3F is a schematic perspective view of a bottom wall 316 of the case 310 of the cleaning module 300, and FIG. 3G is a schematic front view of some components in the lower portion of the cleaning module 300 in accordance with some embodiments. As shown in FIGS. 3E-3G, the bottom wall 316 of the case 310 has a slot 366 corresponding to the cleaning head 326. As best seen in FIG. 3G, the cleaning head 326 has a lower portion 368 over which the wiper tape 330 is guided and which projects outside the case 310 through the slot 366 to bring the wiper tape 330 into contact with the substrate 360. The cleaning module 300 further includes a suction device 370 configured to generate inside the case 310 a negative pressure (compared to the pressure outside the case 310). During a cleaning operation, contaminants C generated by the conductor portion are sucked by the negative pressure into the case 310 via the slot 366. As a result, the contaminants C are prevented from re-adhering to the cleaned surface of the substrate 360. The contaminants C sucked inside the case 310 are further exhausted outside by separate piping. In some embodiments, the suction device 370 is arranged in the case 310. In some embodiments, the suction device 370 is arranged outside the case 310 and is coupled to the interior of the case 310 by a piping 372 to generate the negative pressure in the case 310. In some embodiments, an air flow F, such as the air flow generated by the ventilation device 270 as described with respect to FIGS. 2A-2B, flows around the cleaning module 300 and the substrate 360 further contributes to the movement of the contaminants C into the case 310 via the slot 366 and/or away from the region being cleaned of the substrate 360. The described arrangement for removing contaminants from the substrate being cleaned is an example. Other arrangements for contaminants removal are within the scope of various embodiments.

Figure 4:
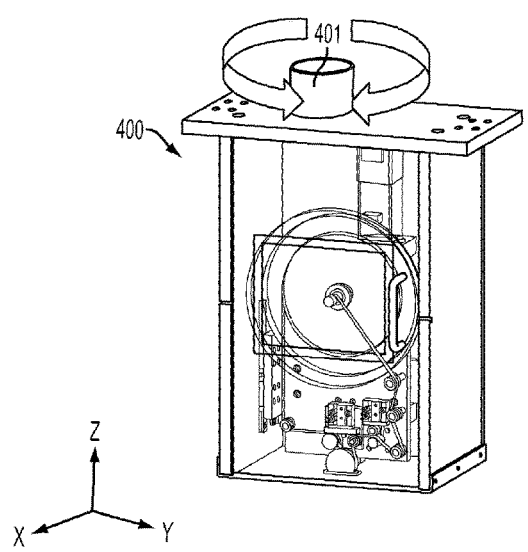
FIG. 4 is a schematic top-front-right perspective view of a cleaning module in accordance with some embodiments.

FIG. 4 is a schematic top-front-right perspective view of a cleaning module 400 in accordance with some embodiments. One difference between the cleaning module 400 and the cleaning module 300 described herein is that the cleaning module 400 is configured to be rotatable about a rotational shaft 401 oriented in the Z direction. In at least one embodiment, both cleaning modules 220, 230 described with respect to FIGS. 2A-2B are replaced by a single cleaning module 400. In at least one embodiment, each of the cleaning modules 220, 230 is replaced by one cleaning module 400. In at least one embodiment where the cleaning module 400 replaces one or both cleaning modules 220, 230, the rotational shaft 401 is coupled to the frame or rail arrangement 218 to suspend the cleaning module 400 above a substrate to be cleaned held on the stage 240. The cleaning module 400 is then used to clean a substrate, such as the photomask 100 as described with respect to FIG. 1B in the X direction or the Y direction. For example, the cleaning module 400 is moved relative to the photomask 100 in the Y direction to clean the line 107 of adhesive residues. At the junction of the line 107 and the next line 108, the cleaning module 400 is rotated about the rotational shaft 401 to orient the cleaning head 326 along the next line 108 to be cleaned. In at least one embodiment, by using the pivotable cleaning module 400, the number of cleaning modules in a cleaning apparatus is reduced. In at least one embodiment, by using the pivotable cleaning module 400, the cleaning operation is performable in various directions other than the X and Y directions, and/or along lines of different shapes other than straight lines. The described arrangement of pivotability of the cleaning module 400 is an example. Other arrangements are within the scope of various embodiments.

Figure 5:
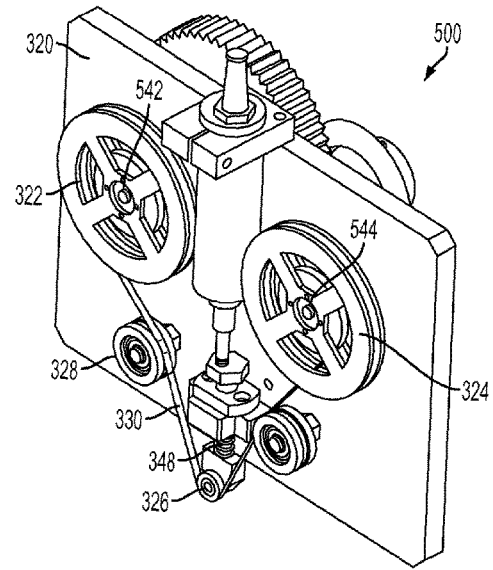
FIG. 5 is a schematic top-front-right perspective view of one or more components of a cleaning module in accordance with some embodiments.

FIG. 5 is a schematic top-front-right perspective view of some components of a cleaning module 500 in accordance with some embodiments. One difference between the cleaning module 500 and the cleaning module 300 described herein is that, in the cleaning module 500, the wiper tape collecting reel 324 and the wiper tape supplying reel 322 are arranged to be rotatable about two corresponding parallel shafts 542, 544. In at least one embodiment, the operation of the cleaning module 500 is similar to that of the cleaning module 300. Compared to the arrangement in the cleaning module 300 where the rotational shafts of the wiper tape supplying reel 322 and wiper tape collecting reel 324 are axially aligned, the parallel arrangement of the rotational shafts in the cleaning module 500 occupies a greater area on the base member 320, but provides easier access to service components of the cleaning module.

Figure 6:
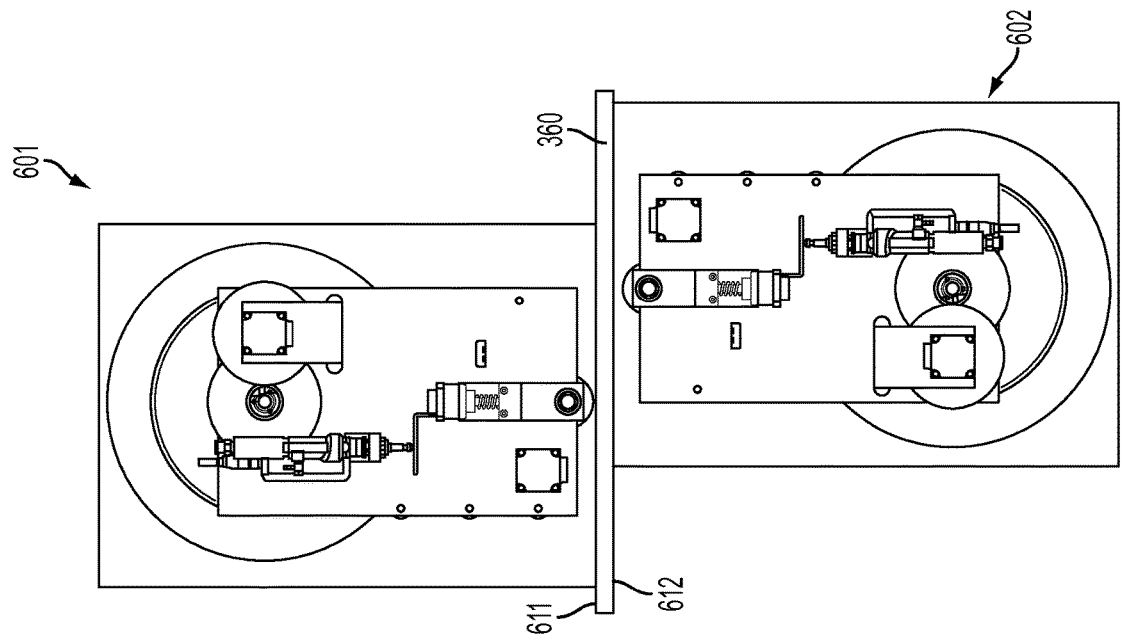
FIG. 6 is a schematic rear view of cleaning modules m a cleaning apparatus in accordance with some embodiments.

FIG. 6 is a schematic rear view of cleaning modules 601, 602 in a cleaning apparatus in accordance with some embodiments. In at least one embodiment, the cleaning modules 601, 602 correspond to one or more of the cleaning modules 220, 230, 300, 400 and 500. The cleaning module 601 is configured to clean a first surface 611 of the substrate 360, whereas the cleaning module 602 is configured to clean a second, opposite surface 612 of the substrate 360 in manners similar to those described with respect to the operations of one or more of the cleaning modules 220, 230, 300, 400 and 500. In at least one embodiment, both surfaces 611, 612 are simultaneously cleaned by the corresponding cleaning modules 601, 602. As a result, the cleaning speed is increased, especially in situations where both surfaces of a substrate are to be cleaned.

Figure 7:
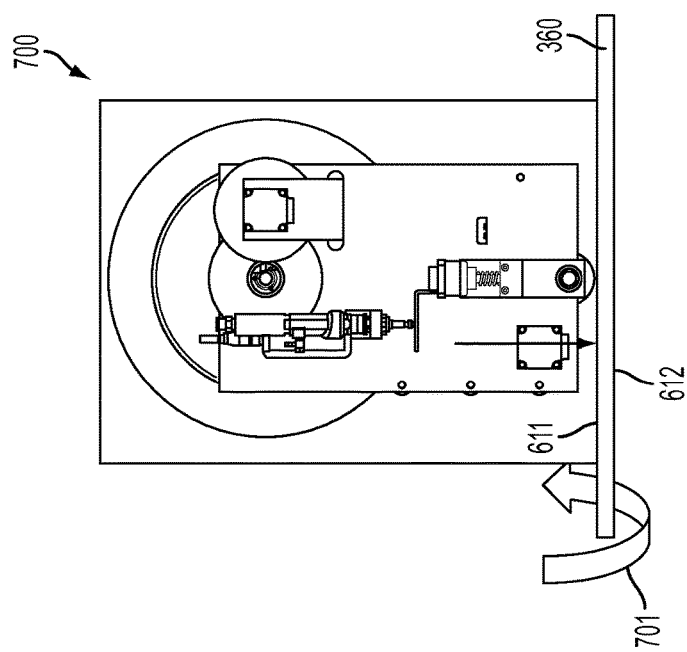
FIG. 7 is a schematic rear view of a cleaning module in a cleaning operation in accordance with some embodiments.

FIG. 7 is a schematic rear view of a cleaning module 700 in a cleaning operation in accordance with some embodiments. In at least one embodiment, the cleaning module 700 corresponds to any one of the cleaning modules 220, 230, 300, 400 and 500. The cleaning module 700 is configured to clean the first surface 611 of the substrate 360, then the substrate 360 is flipped as indicated by the arrow 701, so that the second surface 612 of the substrate 360 is next cleaned by the cleaning module 700. For example, the flipping action is performed by a loader which is configured to load and/or unload substrates to be cleaned and/or cleaned substrates into and/or from the cleaning apparatus. Compared to the arrangement with two cleaning modules described with respect to FIG. 6, the arrangement in accordance with some embodiments as shown FIG. 7 is more compact.

Figure 8:
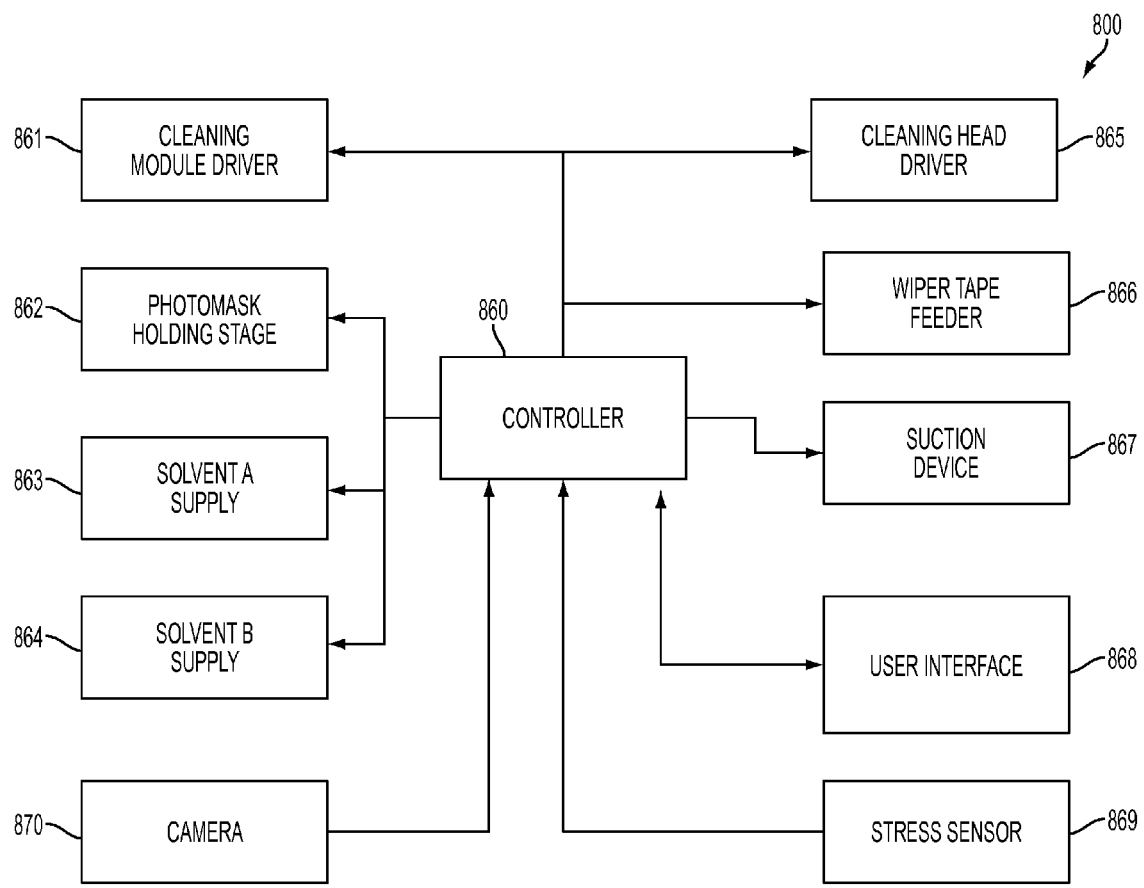
FIG. 8 is a schematic block diagram of a cleaning apparatus in accordance with some embodiments.

FIG. 8 is a schematic block diagram of a cleaning apparatus 800 for cleaning photomasks in accordance with some embodiments. The cleaning apparatus 800 includes a controller 860 coupled with and controlling a cleaning module driver 861, a photomask holding stage 862, solvent supplies 863, 864, a cleaning head driver 865, a wiper tape feeder 866, and a suction device 867. The controller 860 is further coupled with and receives data and/or instruction from an user interface 868, a stress sensor 869, and a camera 870. In at least one embodiment, the controller 860 corresponds to the controller 260, the cleaning module driver 861 corresponds to the driver 338, the photomask holding stage 862 corresponds to the stage 240, the solvent supplies 863, 864 correspond to the cleaning substance storage 250, the cleaning head driver 865 corresponds to a motor for actively driving the cleaning head 326 as described herein, the wiper tape feeder 866 corresponds to the wiper tape feeder 344, the suction device 867 corresponds to the suction device 370, the user interface 868 corresponds to the touch screen 266 and/or other 1/0 described with respect to the controller 260, the stress sensor 869 corresponds to the pressure sensor 340, and the camera 870 corresponds to the camera for monitoring cleaning quality as described herein.

Figure 9:
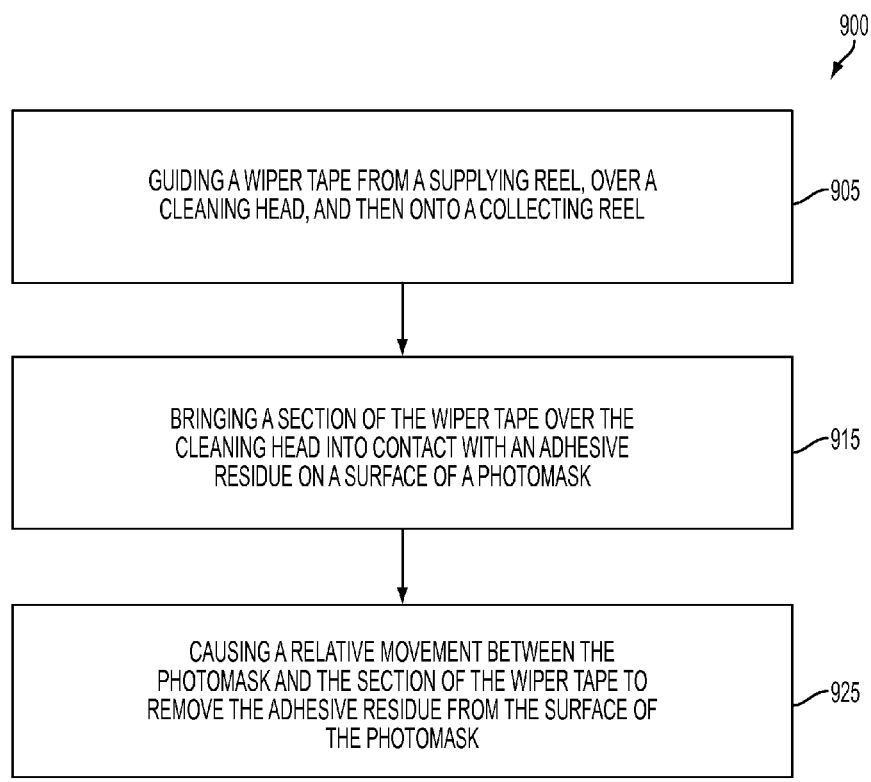
FIG. 9 is a flow chart of a method of cleaning a photomask in accordance with some embodiments.

FIG. 9 is a flow chart of a method 900 of cleaning a photomask in accordance with some embodiments. In at least one embodiment, the method 900 is performed by the cleaning apparatus 200 and/or at least one of the cleaning modules 220, 230, 300, 400, 500, 601, 601, and 700, to clean adhesive residues from the photomask 100 as described herein.

At operation 905, a wiper tape is guided from a supplying reel, over a cleaning head, and then onto a collecting reel. For example, the wiper tape 330 is guided from the wiper tape supplying reel 322, over the cleaning head 326 and then onto the wiper tape collecting reel 324, as described herein.

At operation 915, a section of the wiper tape over the cleaning head is brought into contact with an adhesive residue on a surface of a photomask. For example, a section of the wiper tape 330 over the cleaning head 326 and with a cleaning substance dispensed thereon is brought into contact with the adhesive residues 104 on the photomask 100, as described herein.

At operation 925, a relative movement is generated between the photomask and the section of the wiper tape to remove the adhesive residue from the surface of the photomask. For example, a translational movement T and/or a rotational movement R is/are generated between the wiper tape 330 over the cleaning head 326 and the photomask to remove the adhesive residues from the photomask, as described herein. In some embodiments, one or more cleaning substances are dispensed and/or a stress of the cleaning head 326 on the photomask is controlled and/or contaminants generated by the cleaning operation are sucked away, as described herein.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

In some embodiments, by providing a cleaning apparatus and/or a cleaning module using a wiper tape, automatic cleaning of a substrate, such as a photomask is achievable. As a result, manual cleaning of photomasks after a de-pellicle process is avoidable, saving labor and time for photomask cleaning while ensuring consistency of cleaning efficiency and quality. Compared to manual photomask cleaning, a cleaning apparatus and/or cleaning module m one or more embodiments provide fixed and/or controllable cleaning width and path which result in a lower likelihood of unremoved adhesive residues remaining on the photomask after the cleaning operation. In some embodiments, the pressure exerted on the photomask during the cleaning operation is detected and controlled to be in an acceptable range. As a result, damages to the photomask being cleaned are avoidable, while cleaning performance is improved due to the stable wiping pressure. In some embodiments, contaminants generated by the cleaning operation are sucked away from the photomask being cleaned. As a result, the cleaning quality is improved because contaminants such as adhesive residue and/or cleaning substance are unlikely to re-adhere to the cleaned substrate. Some embodiments provide a multi-module and/or multi-direction and/or multi-solvent cleaning apparatus in which the cleaning operation is controllable by varying one or more factors, including but not limited to, type, direction, number and speed of relative movement between the wiper tape and the photomask, as well as type, amount and dispensing frequency of at least one cleaning substance. The control flexibility permits the cleaning apparatus to be quickly adapted to various types of substrate to be cleaned and/or various types of materials to be removed. A continuous photomask cleaning process suitable for mass production with high success rate and stable quality is thus provided.

In some embodiments, a cleaning module comprises a support structure configured to rotatably support a wiper tape supplying reel and a wiper tape collecting reel, a cleaning head, and a suction device. The cleaning head is configured to, during a cleaning operation, clean a substrate with a wiper tape which is guided continuously along a wiper tape path from the wiper tape supplying reel, around a portion of the cleaning head, and then to the wiper tape collecting reel. The suction device is configured to suck contaminants generated during the cleaning operation away from the portion of the cleaning head.

In some embodiments, a cleaning apparatus comprises a stage configured to support thereon a substrate to be cleaned, and at least one cleaning module moveable relative to the stage. The at least one cleaning module comprises a support structure, a cleaning head, a pressure sensor, and a driver. The support structure is configured to rotatably support a wiper tape supplying reel and a wiper tape collecting reel. The cleaning head is configured to, during a cleaning operation, clean the substrate supported on the stage with a wiper tape which is guided continuously along a wiper tape path from the wiper tape supplying reel, around a portion of the cleaning head, and then to the wiper tape collecting reel. The pressure sensor is configured to detect a pressure exerted by the cleaning head on the substrate. The driver is configured to move the cleaning head in a first direction toward or away from the substrate in response to the pressure detected by the pressure sensor.

In a method of cleaning a photomask in accordance with some embodiments, a wiper tape is guided from a wiper tape supplying reel, over a cleaning head, and then onto a wiper tape collecting reel. A section of the wiper tape over the cleaning head is brought into contact with an adhesive residue on a surface of the photomask. A relative movement is caused between the photomask and the section of the wiper tape to remove the adhesive residue from the surface of the photomask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning apparatus, comprising:
   a stage configured to support thereon a substrate to be cleaned; and
   at least one cleaning module moveable relative to the stage, the at least one cleaning module comprising:
      a support structure configured to rotatably support a wiper tape supplying reel and a wiper tape collecting reel;
      a cleaning head configured to, during a cleaning operation, clean the substrate supported on the stage with a wiper tape which is guided continuously along a wiper tape path from the wiper tape supplying reel, around a portion of the cleaning head, and then to the wiper tape collecting reel;
      a pressure sensor configured to detect a pressure exerted by the cleaning head on the substrate; and
      a driver configured to move the cleaning head in a first direction toward or away from the substrate in response to the pressure detected by the pressure sensor.

2. The cleaning apparatus of claim 1, wherein the at least one cleaning module is moveable relative to the stage in a second direction transverse to the first direction.

3. The cleaning apparatus of claim 1, wherein the at least one cleaning module comprises:
   a first cleaning module moveable relative to the stage in a second direction transverse to the first direction; and
   a second cleaning module moveable relative to the stage in a third direction transverse to the first direction.

4. The cleaning apparatus of claim 1, wherein the at least one cleaning module is rotatable about an axis oriented in the first direction.

5. The cleaning apparatus of claim 1, wherein the cleaning head is rotatable about a rotational axis oriented perpendicular to the first direction, and the at least one cleaning module is moveable relative to the stage in a second direction perpendicular to both the first direction and the rotational axis of the cleaning head.

6. The cleaning apparatus of claim 1, further comprising:
a housing accommodating the at least one cleaning module and the stage therein; and
a ventilation device configured to generate an air flow through the housing and around the at least one cleaning module and the stage.

7. The cleaning apparatus of claim 6, further comprising:
at least one cleaning substance storage accommodated in the housing, the at least one cleaning substance storage configured to supply at least one cleaning substance to clean the substrate with the wiper tape and the at least one cleaning substance at the cleaning head, wherein, in the air flow, the at least one cleaning module and the stage are arranged upstream of the at least one cleaning substance storage.

8. A cleaning apparatus, comprising:
a support structure configured to rotatably support a wiper tape supplying reel and a wiper tape collecting reel;
a cleaning head configured to, during a cleaning operation, clean a substrate supported on a stage with a wiper tape which is guided continuously along a wiper tape path from the wiper tape supplying reel, around a portion of the cleaning head, and then to the wiper tape collecting reel;
a pressure sensor configured to detect a pressure exerted by the cleaning head on the substrate;
a driver configured to move the cleaning head in a first direction toward or away from the substrate in response to the pressure detected by the pressure sensor; and
a suction device configured to remove contaminants generated during the cleaning operation away from the cleaning head, the cleaning head, the wiper tape supplying reel and the wiper tape collecting reel being disposed on a same side of the substrate as the suction device.

9. The cleaning apparatus of claim 8, wherein the cleaning head protrudes through a hole in the support structure.

10. The cleaning apparatus of claim 8 further comprising a first guide roller positioned in the wiper tape path between the wiper tape supplying reel and the cleaning head.

11. The cleaning apparatus of claim 10 further comprising a second guide roller positioned in the wiper tape path between the cleaning head and the wiper tape collecting reel.

12. The cleaning apparatus of claim 8, wherein the suction device is positioned within the support structure.

13. The cleaning apparatus of claim 8, wherein the wiper tape supplying reel and the wiper tape collecting reel rotate about a same axis.

14. The cleaning apparatus of claim 8, wherein the wiper tape supplying reel rotates about a first axis, the wiper tape collecting reel rotates about a second axis, the first axis being parallel to the second axis.

15. A cleaning apparatus, comprising:
a first rotational shaft;
a first support structure coupled to the first rotational shaft, the first support structure configured to rotatably support a first wiper tape supplying reel and a first wiper tape collecting reel;
a first cleaning head coupled to the first support structure, the first wiper tape supplying reel, the first wiper tape collecting reel, and the first cleaning head configured to, during a cleaning operation, guide a first wiper tape continuously along a first wiper tape path from the first wiper tape supplying reel, around a portion of the first cleaning head, and then to the first wiper tape collecting reel;
a pressure sensor configured to detect a pressure exerted by the first cleaning head;
a driver configured to move the first cleaning head in response to the pressure detected by the pressure sensor; and
a suction device configured to remove contaminants generated during the cleaning operation away from the first cleaning head, the first cleaning head, the first wiper tape supplying reel and the first wiper tape collecting reel being disposed on a same side of a substrate as the suction device.

16. The cleaning apparatus of claim 15 further comprising a cleaning substance storage configured to dispense cleaning fluid.

17. The cleaning apparatus of claim 15 further comprising:
a second rotational shaft on an opposite side of the substrate from the first rotational shaft;
a second support structure coupled to the second rotational shaft, the second support structure configured to rotatably support a second wiper tape supplying reel and a second wiper tape collecting reel; and
a second cleaning head coupled to the second support structure, the second wiper tape supplying reel, the second wiper tape collecting reel, and the second cleaning head configured to, during the cleaning operation, guide a second wiper tape continuously along a second wiper tape path from the second wiper tape supplying reel, around a portion of the second cleaning head, and then to the second wiper tape collecting reel.

18. The cleaning apparatus of claim 15 further comprising:
a spring via attached to the first cleaning head, the spring configured to partially absorb the pressure exerted by the first cleaning head on the substrate.

19. The cleaning apparatus of claim 18, wherein the first cleaning head protrudes through an opening in the first support structure.

20. The cleaning apparatus of claim 15 further comprising:
a housing, wherein the first support structure is positioned within the housing; and
a ventilation device attached to the housing, wherein ventilation is configured to maintain a higher pressure within the housing than outside the housing.

* * * * *